(12) United States Patent
Li et al.

(10) Patent No.: US 6,728,146 B1
(45) Date of Patent: Apr. 27, 2004

(54) MEMORY DEVICE AND METHOD FOR AUTOMATICALLY REPAIRING DEFECTIVE MEMORY CELLS

(75) Inventors: Minfu Li, Taipei (TW); Ken Liou, Hsinchu (TW); Min Nan Yen, Taipei (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/189,134

(22) Filed: Jul. 3, 2002

(51) Int. Cl.[7] .................................................. G11C 7/00
(52) U.S. Cl. .............. 365/200; 365/189.01; 365/189.12
(58) Field of Search ........................... 365/200, 189.01, 365/189.12, 226, 230.08, 240

(56) References Cited

U.S. PATENT DOCUMENTS 6,430,096 B1 * 8/2002 Grass ........................... 365/201
6,442,083 B2 * 8/2002 Hotaka ........................ 365/200
6,577,534 B2 * 6/2003 Tsuruda .................. 365/185.09
2002/0039311 A1 * 4/2002 Takeuchi et al. ........ 365/185.09

* cited by examiner

*Primary Examiner*—David Lam
(74) *Attorney, Agent, or Firm*—Martine & Penilla, LLP (57) ABSTRACT

A memory device that is capable of automatically repairing itself includes a working cell array, a redundancy cell array, a control logic, and a lookup table. The working cell array includes a plurality of working memory cells and the redundancy cell array includes a plurality of redundancy memory cells. The control logic controls reading and writing of data to the working cell array and the redundancy cell array. The lookup table stores addresses of the data stored in the redundancy cell array. In a method for automatically repairing a defective memory cell, when a working memory cell is determined to be defective, the data is written to a redundancy memory cell and the address of the redundancy memory cell and an address of the working memory cell are updated in the lookup table. A method for accessing a memory device also is described.

20 Claims, 8 Drawing Sheets

MEMORY DEVICE AND METHOD FOR AUTOMATICALLY REPAIRING DEFECTIVE MEMORY CELLS

BACKGROUND OF THE INVENTION

1. Field of the Invention

The present invention relates generally to digital memory systems and, more particularly, to a memory device, a method for automatically repairing defective memory cells, and a method for accessing a memory device.

2. Description of the Related Art

Memory devices typically include an array of memory cells. If one memory cell fails (i.e., fails to store the data written into the memory cell), then the complete array may have to be scrapped. Typical memory devices include several sectors or arrays. Each of the arrays includes several working cells and at least one redundancy cell. If one of the working cells fails, then the redundancy cell can be substituted for the failed working cell and the data can be stored in the redundancy cell in the same array.

One of the shortfalls of conventional memory devices is that if the number of failed working cells in a first array is greater than the number of redundant cells in the same array, then all of the failed working cells cannot be replaced. Therefore, the entire memory device has failed and must be replaced. In addition, even if a second array has unused redundant cells, the first array cannot use the unused redundant cells from the second array to replace failed working cells in the first array. Therefore, the unused redundant cells in the second array may go unused.

Memory devices are typically repaired in the fabrication facility. For example, in the case in which a redundant cell is used to replace a failed working cell, a fuse is set with, e.g., a laser, so that the redundant cell is activated or the failed working cell is deactivated. In the field, however, if the working cell fails (e.g., when the memory device is being used), then the failed working cell cannot be replaced and entire memory device must be replaced.

Therefore, in view of the foregoing, what is needed is a technique for automatically repairing a failed memory device that is capable of repairing the memory device either in the fabrication facility or in the field.

SUMMARY OF THE INVENTION

Broadly speaking, the present invention fills this need by automatically replacing a failed working memory cell with a redundancy memory cell. By way of example, the present invention may be implemented in the form of a system, an apparatus, a method, a device, or a computer readable media.

In accordance with one aspect of the present invention, a memory device that is capable of automatically repairing itself is provided. The memory device includes a working cell array, a redundancy cell array, a control logic, and a lookup table. The working cell array includes a plurality of working memory cells. The redundancy cell array includes a plurality of redundancy memory cells. The control logic controls reading and writing of data to the working cell array and the redundancy cell array. The lookup table stores addresses of the data stored in the redundancy cell array.

In one embodiment, the memory device includes a power down detector to detect a power off voltage. The memory device also may include a low voltage detector for detecting a power on voltage. In one embodiment, the control logic includes at least one control register and the lookup table includes at least one latch register.

In one embodiment, the redundancy cell array is distributed between at least two sectors. In another embodiment, the redundancy cell array is included in one sector. In one embodiment, the redundant cell array includes one data byte per sector and three address bytes per sector. In one embodiment, the redundancy cell array includes a data portion in a first sector and an address portion in a second sector. In another embodiment, the redundancy cell array includes a status portion in a third sector.

In accordance with another aspect of the present invention, a method for automatically repairing a defective memory cell in a memory device is provided. In this method, data is written to a working memory cell. The data written to the working memory cell is then read. The data written to the working memory cell and the data read from the working memory cell are compared. If the data written to the working memory cell and the data read from the working memory cell are not equal, i.e., the same, then the data is written to a redundancy memory cell and an address of the redundancy memory cell and an address of the working memory cell are updated in a lookup table.

In one embodiment, the data is read from the redundancy memory cell. In this embodiment, the data written to the redundancy memory cell is compared to the data read from the redundancy memory cell. If the data written to the redundancy memory cell and the data read from the redundancy memory cell are not equal, then the data is written to another redundancy memory cell.

In one embodiment, the method further includes detecting a power off condition in the memory device and storing the lookup table. In one embodiment, the lookup table is stored in a redundancy cell array that includes the redundancy memory cell.

In one embodiment, the method further includes detecting a power on condition in the memory device and initiating the lookup table. In this embodiment, the operation of initiating the lookup table includes reading the lookup table from a redundancy cell array that includes the redundancy memory cell.

In accordance with yet another aspect of the present invention, a method for accessing a memory device is provided. In this method, an address for data is received. It is then determined whether the address is included in a lookup table. If the address is not included in the lookup table, then the data is accessed in the working memory cell. If the address is included in the lookup table, then the data is accessed in the redundancy memory cell at an address corresponding to the address in the lookup table.

The present invention advantageously enables a failed working memory cell in a memory device to be automatically repaired at any time, e.g., in the fabrication facility or in the field. This significantly improves the reliability of memory devices. Such improved reliability reduces both the number of memory devices that must be scrapped during the manufacturing process and also the number of memory devices that must be replaced after use in the field and thereby reduces the costs associated with the manufacture and sale of memory devices.

Other aspects and advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF EXEMPLARY EMBODIMENTS

Several exemplary embodiments for automatically repairing memory cells will now be described. It will be apparent to those skilled in the art that the present invention may be practiced without some or all of the specific details set forth herein.

Memory device manufacturers are under constant pressure to decrease manufacturing costs and increase memory reliability. Repairing failed working cells is desirable because it decreases manufacturing costs and increases reliability. If a memory device includes a failed working cell, then the entire memory device must be scrapped unless the failed working cell can be repaired. Thus, repairing failed working cells increases production yield by reducing scrapped memory devices. Increased production yield also provides increased memory device sales from memory devices that would otherwise have been scrapped. Working cells in a memory device also may fail when the memory device is being used in the field. When this happens, the user must return the failed memory device to the memory device manufacturer for a working memory device. This is undesirable because it not only increases costs, but also may adversely impact the quality reputation of the memory device manufacturer.

Figure 1:
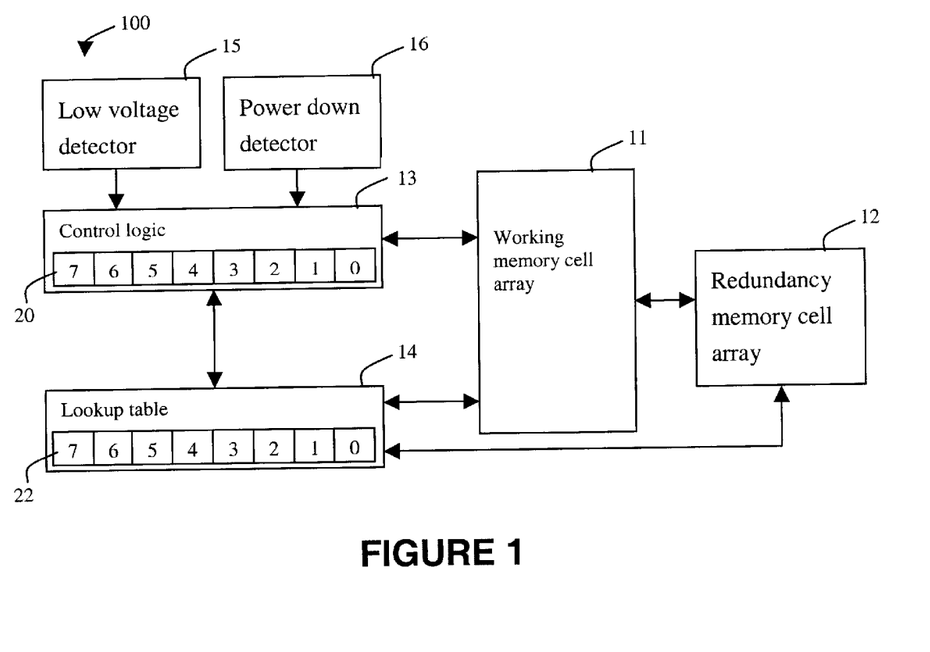
FIG. 1 is a block diagram of a memory device that is capable of automatically repairing itself in accordance with one embodiment of the present invention.

FIG. 1 is a block diagram of an auto-repair memory device 100 in accordance with one embodiment of the present invention. As shown in FIG. 1, the auto-repair memory device 100 includes a working cell array 11, a redundancy cell array 12, a control logic 13, a lookup table 14, a low voltage detector 15, and a power down detector 16.

The working cell array 11 can include a number of sectors, and each sector can include a large number of working memory cells. The redundancy cell array 12 can include a desired number of redundancy memory cells. The structure of the redundancy memory cells can be varied to suit the needs of particular applications. By way of example, the redundancy memory cells can be all in one sector or can be distributed between two or more sectors. In another example, the redundancy memory cells can include one data byte per sector and three address bytes per sector. In yet another example, the data portion of the redundancy memory cells can be in one sector and the address portion of the redundancy memory cells in a second sector. If desired, a status portion of the redundancy memory cells may be provided in a third sector. The redundancy memory cells can include a combination of memory types. By way of example, the redundancy memory cells may be flash memory cells. The data portion of the redundancy memory cells can be flash-type memory cells while the address and status portions of the redundancy memory cells can be a redundancy programmable logic array (RPLA).

The control logic 13 controls the reading and writing of the data to the memory device 100. The control logic 13 also controls the power on/off procedure, and the status of the lookup table 14. The control logic 13 can include a control register 20. In one embodiment, the control register 20 includes 8 bits (e.g., bits 0–7). It will be apparent to those skilled in the art that the number of bits in control register 20 may be varied from that shown in FIG. 1.

In one embodiment, the status of the lookup table 14 includes F, M, P, and ARF states. An "F" status indicates that the lookup table 14 is full. An "M" status indicates that more redundancy memory cells are needed. An "ARF" status indicates that the auto-repair function is enabled. A "P" status indicates that the memory device 100 is in privilege mode. In privilege mode, operations such as read, write, etc. are for redundancy cell array 12. In one embodiment, the lookup table 14 includes latch registers 22, which store the corresponding addresses of the data in the redundancy cell array 12 and the working cell array 11. In one embodiment, the address portion of the lookup table 14 includes three bytes (i.e., 24 bits). The lookup table 14 also may be a RPLA.

The power down detector 16 detects the power applied to the memory device 100. As the power is going down (e.g., the power is being removed from the memory device 100), the lookup table 14 is saved. In one embodiment, the look-up table 14 is saved in the redundancy cell array 12. The low voltage detector 15 detects the voltage of the memory device 100. When the voltage reaches a lowest working voltage (e.g., when the voltage is being applied to the memory device 100 such as during a power-on process), the control logic 13 is reset and the addresses of the data stored in the redundancy cell array 12 are copied to the lookup table 14.

Figure 2:
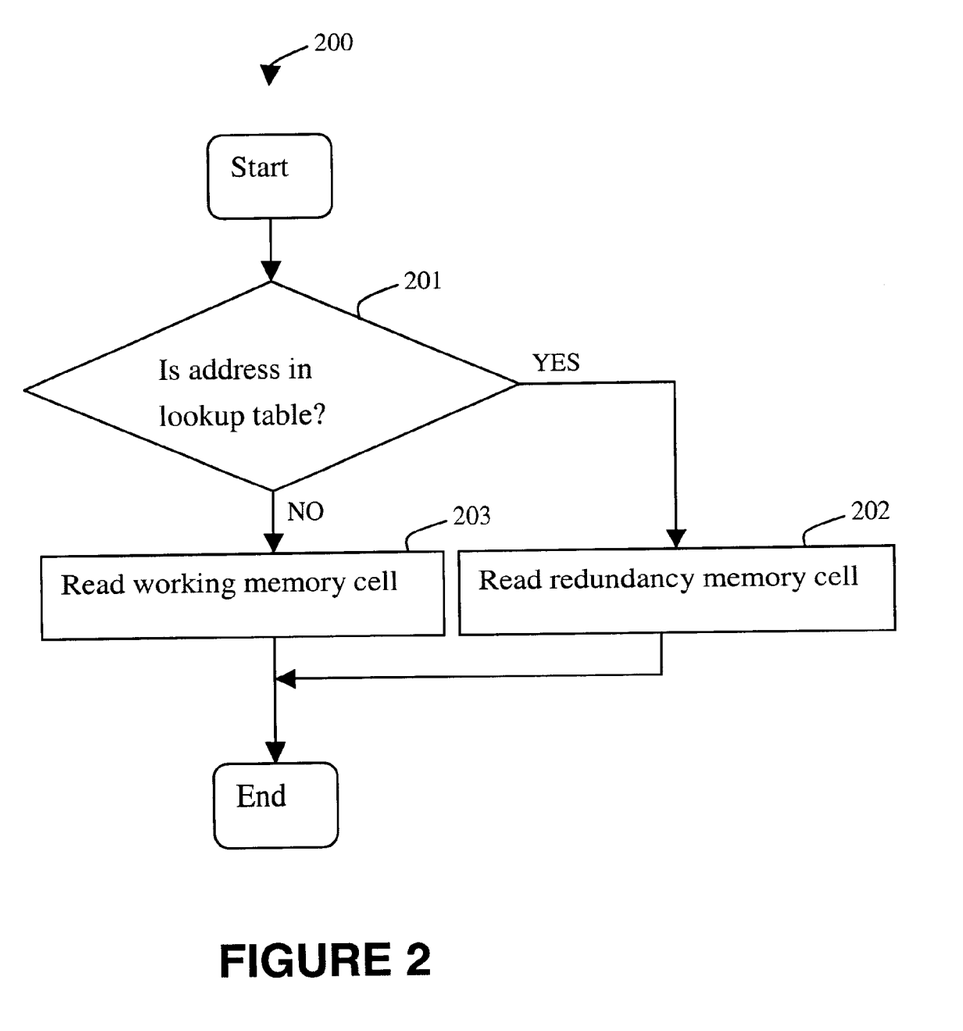
FIG. 2 is a flowchart diagram that illustrates the method operations performed in accessing, e.g., reading, a memory device in accordance with one embodiment of the present invention.

FIG. 2 is a flowchart diagram that illustrates the method operations 200 performed in accessing, e.g., reading, a memory device in accordance with one embodiment of the present invention. The method begins in decision operation 201 in which the address of the data to be read is examined to determine whether the address falls in the lookup table 14 (see FIG. 1). If the address does not fall in the lookup table 14, then the method proceeds to operation 203 in which the data from the working cell array 11 is read. If the address falls in the lookup table 14, then the method proceeds to operation 202 in which the data from the redundancy cell array 12 (see FIG. 1) is read. In one embodiment, the address will fall in the lookup table 14 if the working memory cell identified by the address has been previously identified as a failed working memory cell and therefore the redundancy memory cell has been assigned to substitute for the failed working memory cell. The lookup table 14 records the assignment of the redundancy memory cell for the corresponding failed working memory cell. Once the data has been read in either operation 202 or operation 203, the method is done.

Figure 3:
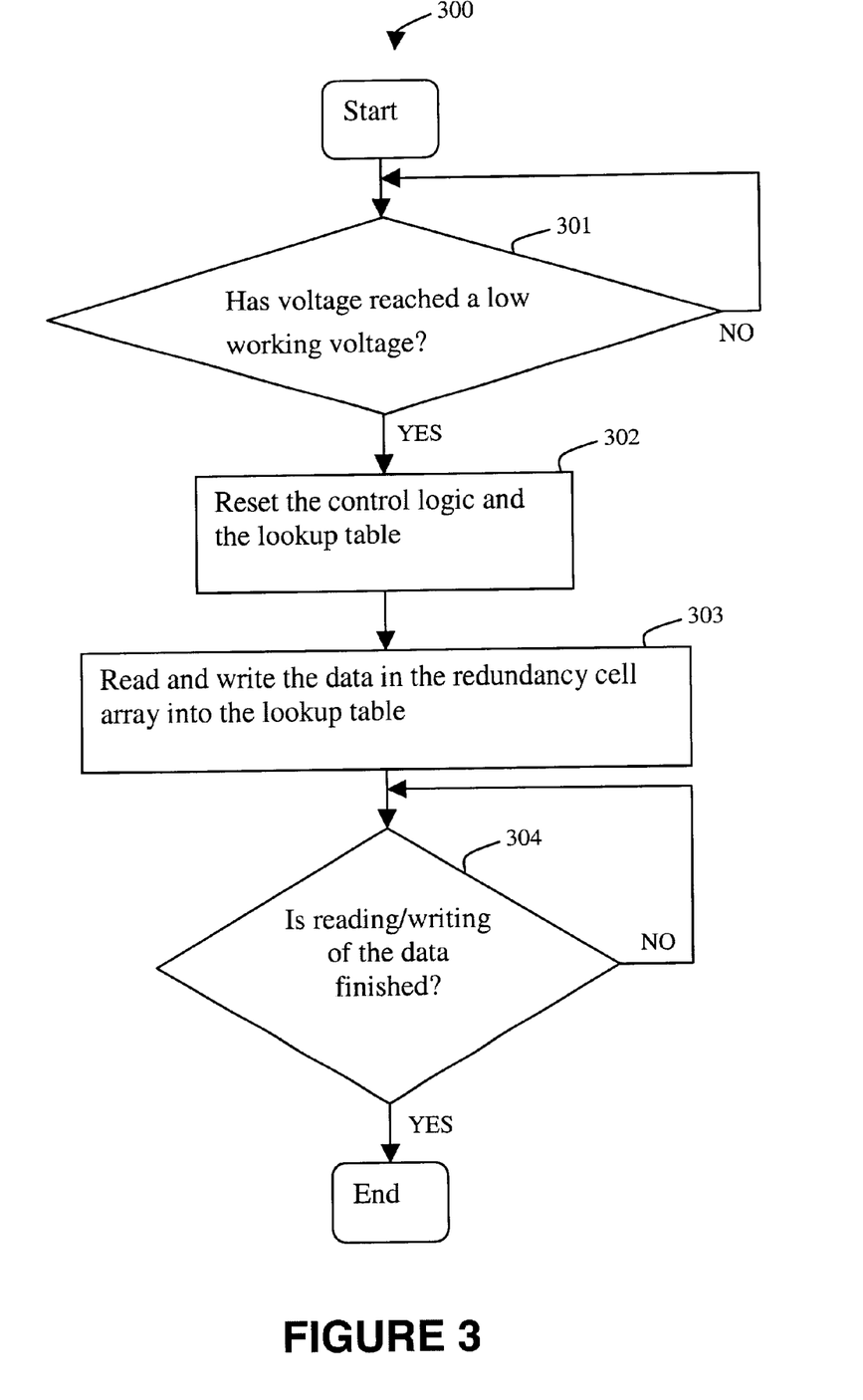
FIG. 3 is a flowchart diagram that illustrates the method operations performed in the memory device during a power-on process in accordance with one embodiment of the present invention.

FIG. 3 is a flowchart diagram that illustrates the method operations 300 performed in he memory device 100 shown in FIG. 1 during a power-on process in accordance with one embodiment of the present invention. As shown in FIG. 3, the method begins in decision operation 301 in which the voltage supplied to the working memory cell array 11 (see FIG. 1) is monitored to determine when the voltage reaches a low working point. The low working point voltage can be any minimum voltage at which the memory device 100 can operate. If the voltage does not reach the low working point, then operation 301 is repeated, i.e., the applied voltage is further monitored. When the voltage reaches the low working point, the method proceeds to operation 302 in which the control logic 13 and the lookup table 14 are reset. By way of example, the control logic 13 can be reset by setting all bits in the control register 20 to zero. The lookup table 14 can be reset by clearing all contents from the lookup table.

Once the control logic 13 and the lookup table 14 have been reset, the method proceeds to operation 303 in which the data designated for the lookup table 14 is read and written into the lookup table 14. In one embodiment, the data designated for the lookup table is stored in the redundancy memory cell array 12. In decision operation 304, the reading/writing of the data into the look-up table is monitored and a determination is made as to whether the reading/writing of the data is finished. If the reading/writing of the data is not finished, then the method returns to operation 303. Once the reading/writing of the data is finished, then the method is done, i.e., the power-on process is completed, and the memory device 100 is available for normal operations such as reading, writing, erasing, etc.

Figure 4A:
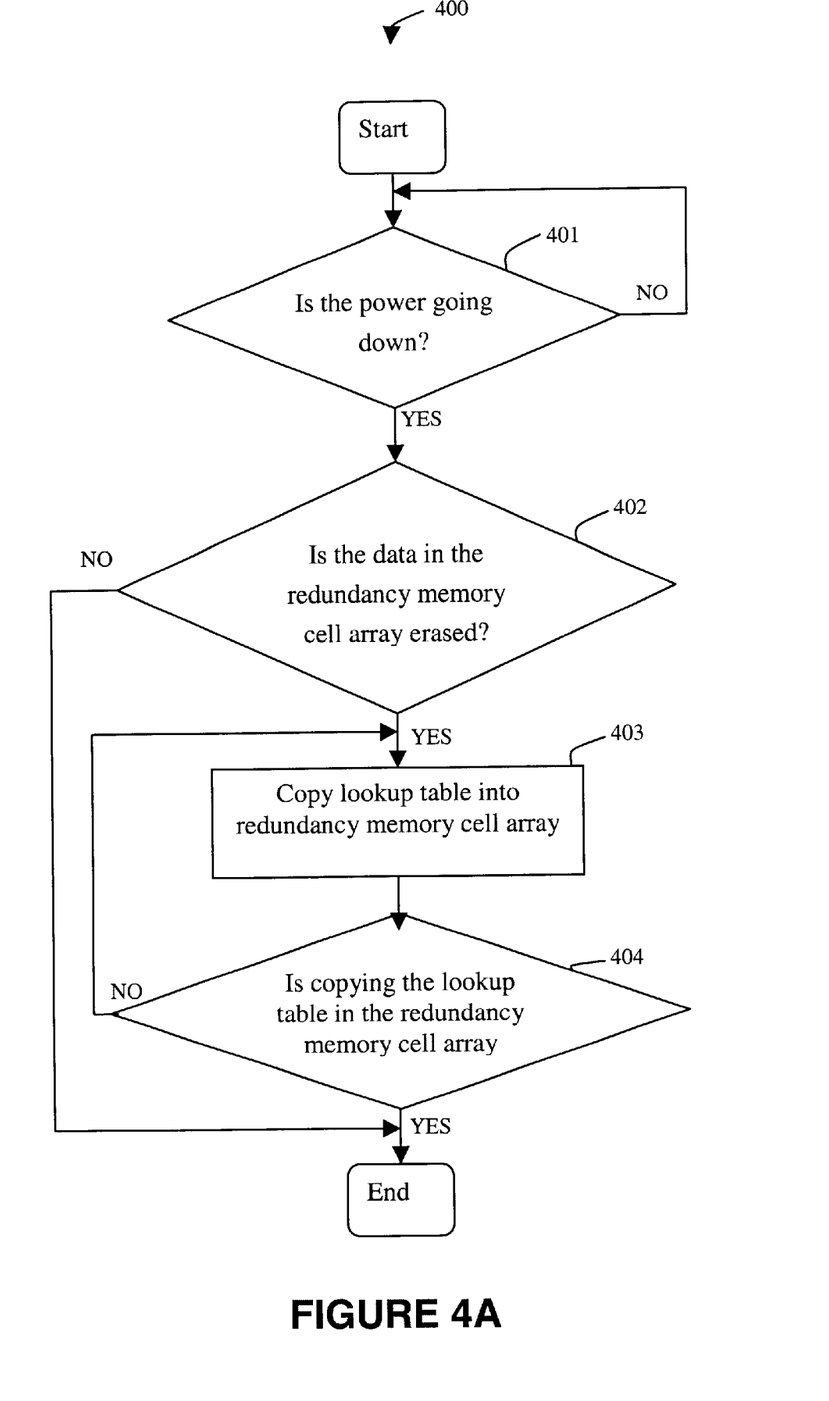
FIG. 4A is a flowchart diagram that illustrates the method operations performed in the memory device during a power-off process in accordance with one embodiment of the present invention.

FIG. 4A is a flowchart diagram that illustrates the method operations 400 performed in the memory device 100 shown in FIG. 1 during a power-off process in accordance with one embodiment of the present invention. As shown in FIG. 4A, the method begins in decision operation 401 in which the voltage applied to the memory device 100 is monitored to determine whether the power is going down (e.g., has been removed or is otherwise interrupted). If the power is not going down, then operation 401 is repeated. When the power is removed, the voltage drops off over a period of time and a slight voltage drop below the normal working voltage can be detected. In one embodiment, the write operations are disabled before the voltage drops below the low working voltage. When the power goes down, the method proceeds to operation 402 in which a determination is made as to whether the data in the redundancy cell array 12 is erased. If the data is erased, then the lookup table 14 is copied into the redundancy cell array 12 in operation 403. Next, in decision operation 404, it is determined whether the lookup table 14 is fully copied into the redundancy cell array 12. If the lookup table 14 is not fully copied into the redundancy cell array 12, then the method returns to operation 403. When the lookup table 14 is fully copied into the redundancy cell array 12, the power-off process ends and the method is done. In an alternate embodiment, the lookup table 14 can be stored in any other memory locations within the memory device 100 or combinations of memory locations instead of or in addition to the redundancy memory cell array. The memory device 100 may also include a dedicated lookup table memory for storing the lookup table 14.

Figure 4B:
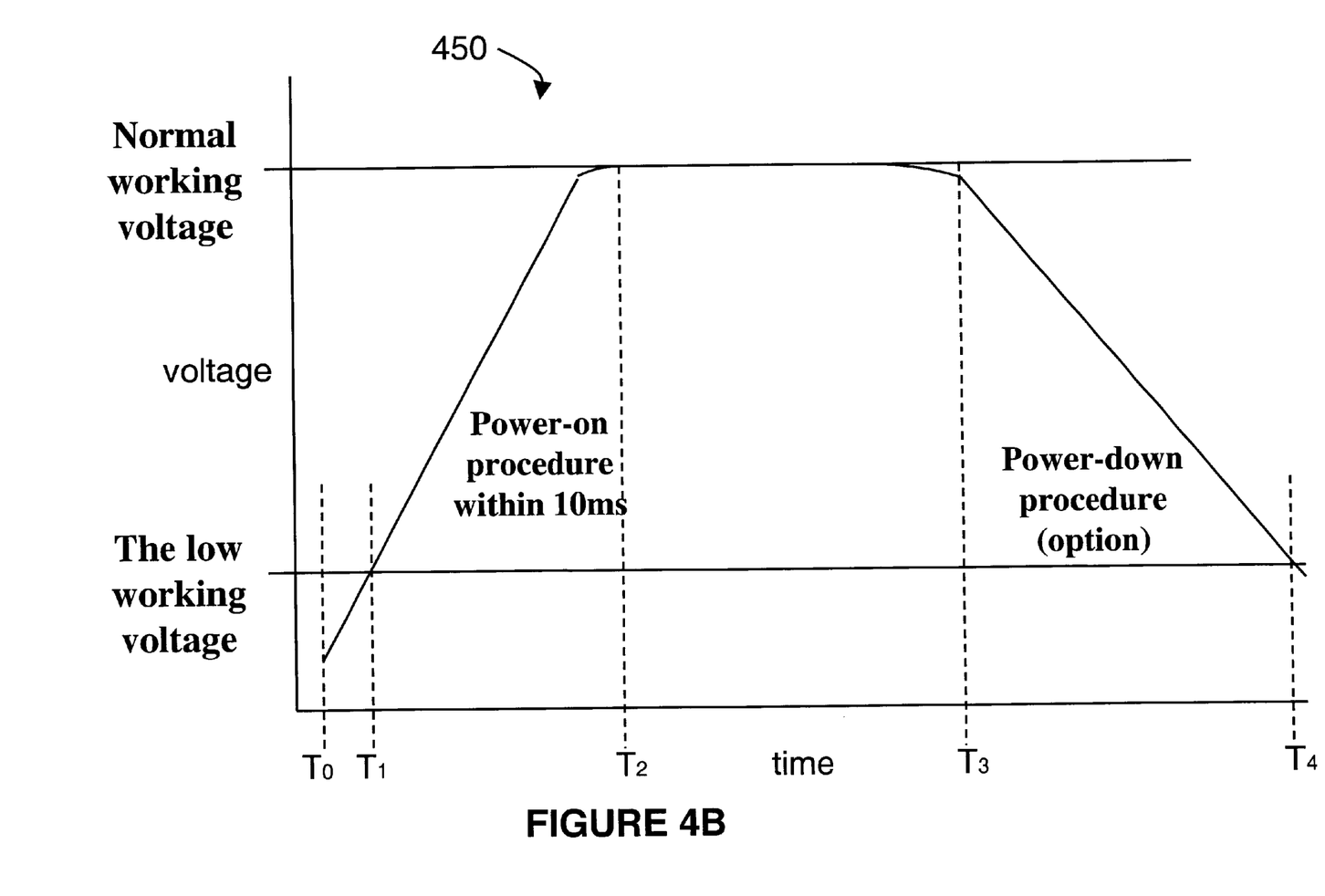
FIG. 4B is a graph of the voltage applied to the memory device versus time.

FIG. 4B is a graph 450 of the voltage applied to the memory device 100 shown in FIG. 1 versus time. During the power-on period (i.e., from time T0 to time T2), the voltage varies from zero volts (or near zero volts) to the normal working voltage. At time Ti, as the voltage ramps toward the normal working voltage, the voltage meets the low working voltage. When the voltage meets the low working voltage, the low voltage detector 15 can initiate a power-on procedure such as described in FIG. 3 above. While the normal working voltage is applied to the memory device 100 (i.e., from time T2 to time T3) the memory device 100 functions normally. At (or slightly before) time T3, as shown on the graph 450, the voltage drops below the normal working voltage level. The power-down procedure (e.g., as described with reference to FIG. 4A above) can then be initiated and completed before time T4 when the voltage drops below the low working voltage.

Figure 5A:
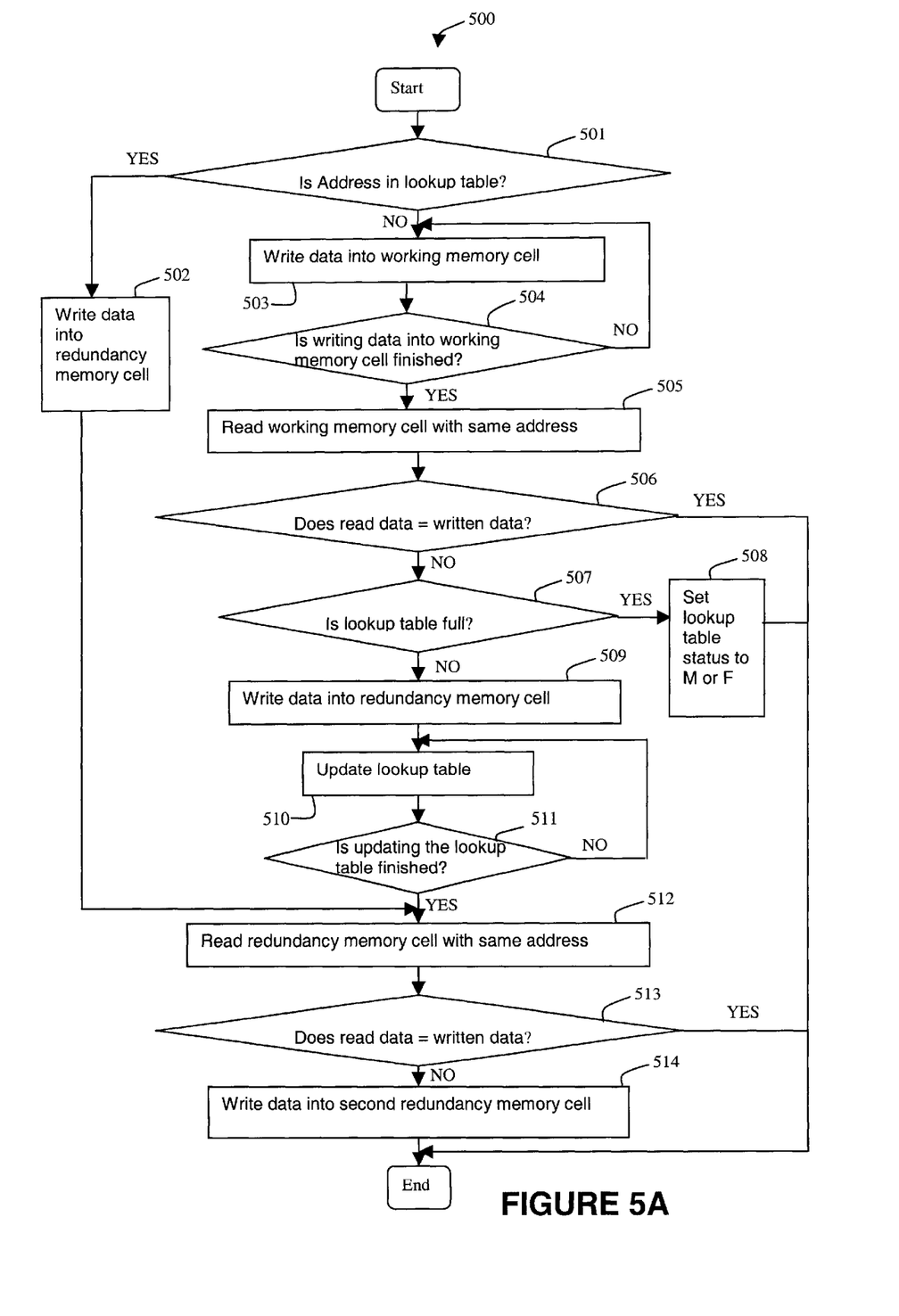
FIG. 5A is a flowchart diagram that illustrates the method operations performed in automatically repairing a defective memory cell in a memory device in accordance with one embodiment of the present invention.

FIG. 5A is a flowchart diagram that illustrates the method operations 500 performed in automatically repairing a defective memory cell in a memory device, e.g., the memory device 100 shown in FIG. 1, in accordance with one embodiment of the present invention. As shown in FIG. 5A, in decision operation 501, an address is accessed and the lookup table 14 is queried to determine whether the address of the working memory cell is in the lookup table 14 with a corresponding address of the redundancy memory cell. If both of the addresses are in the lookup table 14, then the method proceeds to operation 502 in which the data is written into the redundancy memory cell. Both of the addresses of the working memory cell and the redundancy memory cell will be in the lookup table if the working memory cell had been previously identified as a failed working memory cell and the redundancy memory cell has been assigned to replace the failed working memory cell. After operation 502, the method proceeds to operation 512, which is described below. If the working memory cell address is not in the lookup table 14 (i.e., the working memory cell was not previously determined to have failed), then the method proceeds to operation 503 in which the data is written into the working memory cell. In decision operation 504, the writing of the data to the working memory cell is monitored and it is determined whether the writing of the data into the working memory cell is finished. If the writing of the data into the working memory cell is not finished, then operation 503 is repeated. On the other hand, if the writing of data into the working memory cell is finished, then the method proceeds to operation 505.

In operation 505, the data is read from the working memory cell with the same address. Next, in decision operation 506, the data read in operation 505 is compared to the data written in operation 503. If it is determined that the data read is equal to, i.e., the same as, the data written, then the method is done. On the other hand, if it is determined that the data read is not equal to the data written, then the lookup table 14 is examined in decision operation 507 to determine whether the lookup table 14 is full. In one embodiment, the lookup table 14 may be full because all the redundant cells have been assigned to substitute for corresponding failed working memory cells. If the lookup table is full, then status of the lookup table 14 is set to either M or F in operation 508. As set forth above, an F status indicates that the lookup table 14 is full and an M status indicates that more redundancy memory cells are needed. The status of the lookup table 14 is set to F if the lookup table 14 is full. The status of the lookup table 14 is set to M if the lookup table 14 is full and additional redundancy memory cells are needed. For example, when the lookup table 14 is first filled, the status of the lookup table 14 will be set to F. When a subsequent working memory cell fails and no more redundancy memory cells are available to be assigned to substitute for the subsequently failed working memory cell, then the status of the lookup table 14 is set to M.

If it is determined in decision operation 507 that lookup table 14 is not full, then the data is written into a selected redundancy memory cell in operation 509. Next, in operation 510, the lookup table 14 is updated so that the address of the failed working memory cell is correlated to the address of the selected redundancy memory cell. In decision operation 511, the lookup table update operation is monitored to determine whether this update operation is finished. If the updating of the lookup table 14 is not completed, then operation 510 is repeated. On the other hand, if the updating of the lookup table 14 is completed, then the process continues in operation 512.

In operation 512, the data is read from the redundancy memory cell using the same address to confirm that the selected redundancy memory cell is functional and properly recorded the data. In decision operation 513, the data read in operation 512 is compared to the data written in operation 509. If it is determined that the data read is equal to the data written, then the method is done. On the other hand, if it is determined that the data read is not equal to the data written, then the data is written into a second redundancy memory cell in operation 514. Once the data is written into the second redundancy memory cell, the method is done.

Figure 5B:
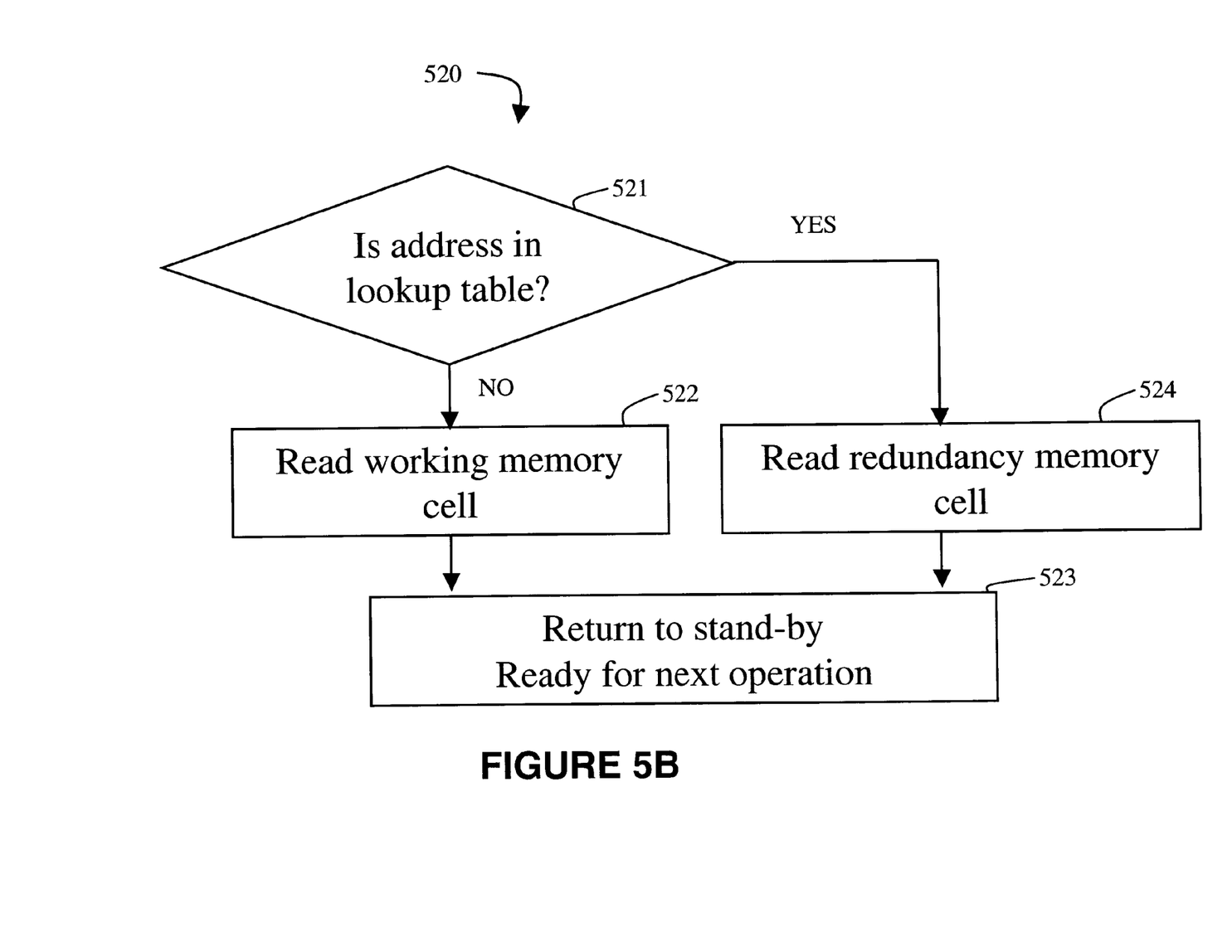
FIG. 5B is a flowchart diagram that illustrates the method operations performed in executing a read access in accordance with one embodiment of the present invention.

As described above, when a failed working memory cell is accessed (e.g., an address of a failed working cell is accessed), the lookup table 14 will redirect the access to the corresponding redundancy memory cell. FIG. 5B is a flowchart diagram that illustrates the method operations 520 performed in executing a read access in accordance with one embodiment of the present invention. In operation 521, the address of the read access is examined to determine whether the address is in the lookup table 14. If the address is not in the lookup table 14, then the working memory cell identified by the address is accessed in operation 522. On the other hand, if it is determined in operation 521 that the address is in the lookup table 14, then the corresponding redundancy memory cell is accessed (i.e., the data is read from the corresponding redundancy memory cell) in operation 524. After these access operations, the memory device 100 stands by for a next function in operation 523.

Figure 5C:
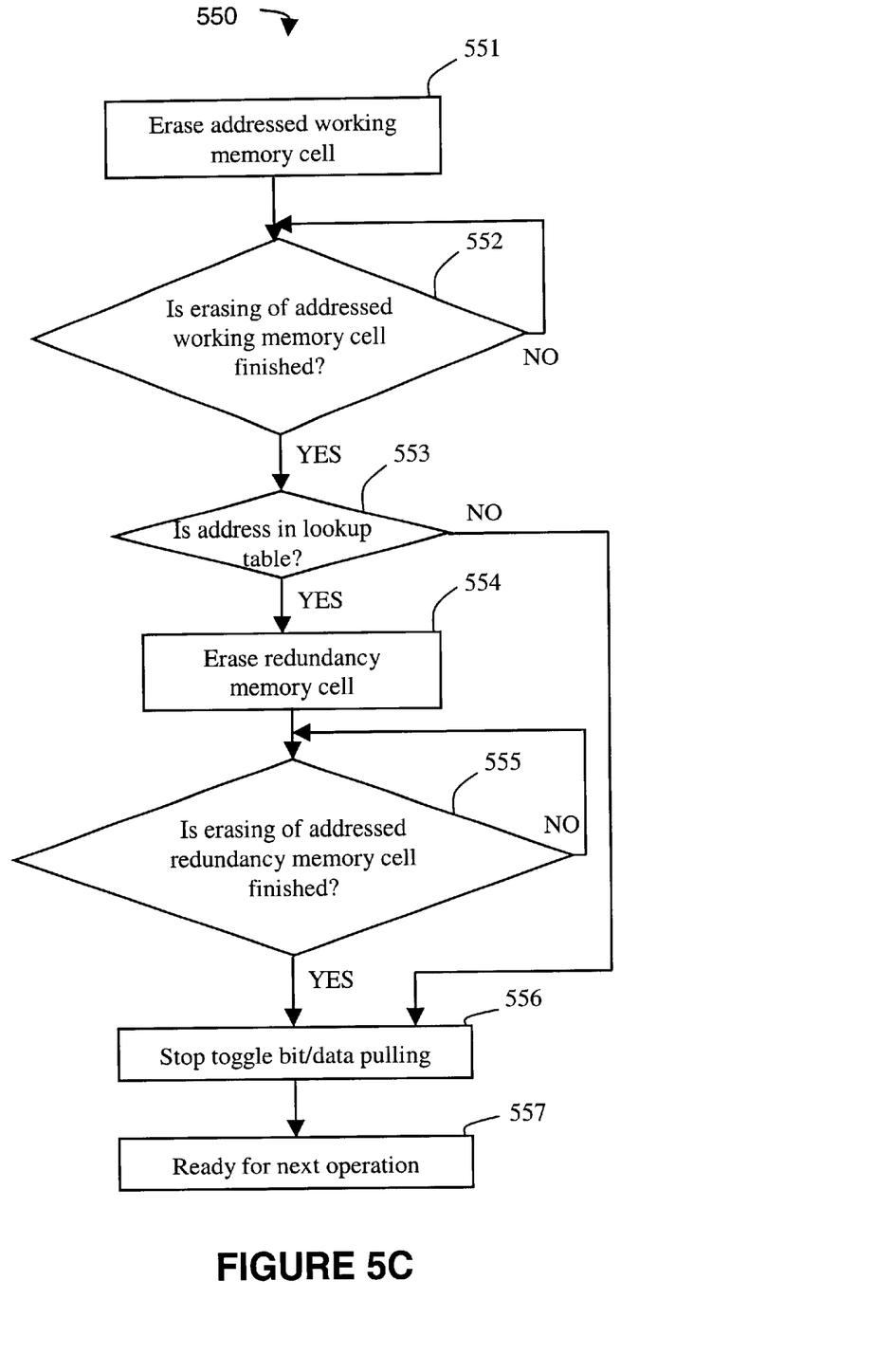
FIG. 5C is a flowchart diagram that illustrates the method operations performed in erasing a memory cell in accordance with one embodiment of the present invention.

FIG. 5C is a flowchart diagram that illustrates the method operations 550 performed in erasing a memory cell in accordance with one embodiment of the present invention. The method begins in operation 551 in which an erase command to erase a memory cell at a selected address is received in a memory device, e.g., the memory device 100 shown in FIG. 1. As shown in FIG. 5C, in decision operation 552, the erase function is monitored and a determination is made as to whether the erase operation is finished. If the erase function is not finished, then the method continues to monitor the erase function. When it is determined that the erase function is completed, the method continues in decision operation 553.

In decision operation 553, the lookup table 14 is examined to determine whether the selected address is in the lookup table. If the selected address is not in the lookup table 14, the method continues in operation 556, which is described below. On the other hand, if the selected address is in the lookup table 14, then the data in the corresponding redundancy memory cell is erased in operation 554. Next, in decision operation 555, the erase operation is monitored and a determination is made as to whether the erase operation is finished. If the erase function is not finished, then the method continues to monitor the erase function. When it is determined that the erase function is completed, the method proceeds to operation 556 in which the toggle bit/data pulling is stopped. Once the toggle bit/data pulling is stopped, the method is done and the memory device stands ready for a next operation in operation 557.

As set forth above in connection with the description of FIG. 1, the control logic 13 may include a control register 20. In one embodiment, the control register 20 includes 8 bits (e.g., bits 0–7). Bit 0 is the F status bit of the lookup table 14. A "0" in the bit 0 indicates that the lookup table 14 status is "not full." A "1" in the bit 0 indicates that the lookup table 14 status is "full" (e.g., all entries in the lookup table are full). Bit 1 is the M status bit of the lookup table 14. A "0" in the bit 1 indicates the lookup table 14 status is "no additional redundancy memory cells needed." A "1" in the bit 1 indicates that the lookup table 14 status is "additional redundancy memory cells are needed." Bit 2 is the privilege "P" mode status bit of the lookup table 14. A "0" in the bit 2 indicates the lookup table 14 status is "not in privilege mode." A "1" in the bit 2 indicates the lookup table 14 status is "in privilege mode." When the lookup table 14 status is in the privilege mode, all access (e.g., read, write, erase, etc.) is directed to the redundancy memory cells. Bit 3 is the auto repair function (ARF) enable status bit. A "0" in the bit 3 indicates the auto repair function is disabled. A "1" in the bit 3 indicates that the auto repair function is enabled. In one embodiment, the control register 20 is examined to determine a function. For example, if a write command is received by the control logic 13, and the bit 2 is set to "1" (i.e., the memory device is in privilege mode), then the write command is directed to the redundancy memory cells.

It is to be understood that the instructions represented by the operations shown in FIGS. 2–5C are not required to be performed in the order illustrated, and that all the processing represented by these operations may not be necessary to practice the various methods. In addition, it will be apparent to those skilled in the art that the methods shown in FIGS. 2–5C also can be implemented in software stored in one or more memory devices.

In summary, the present invention provides a memory device that is capable of automatically repairing itself, a method for automatically repairing a defective memory cell in a memory device, and a method for accessing a memory device. The invention has been described herein in terms of several exemplary embodiments. Other embodiments of the invention will be apparent to those skilled in the art from consideration of the specification and practice of the invention. The embodiments and preferred features described above should be considered exemplary, with the scope of the invention being defined by the appended claims and their equivalents.

What is claimed is:

1. A memory device, comprising:
 a working cell array including a plurality of working memory cells;
 a redundancy cell array including a plurality of redundancy memory cells;
 a control logic for controlling reading and writing of data to the working cell array and the redundancy cell array; and
 a lookup table that stores corresponding addresses of the data stored in a redundancy memory cell and a failed working memory cell.

2. The memory device of claim 1, further comprising a power down detector for detecting a power off voltage of the memory device.

3. The memory device of claim 1, further comprising a low voltage detector for detecting a power on voltage of the memory device.

4. The memory device of claim 1, wherein the control logic includes at least one control register.

5. The memory device of claim 1, wherein the lookup table includes at least one latch register.

6. The memory device of claim 1, wherein the redundancy cell array is included in a single sector.

7. The memory device of claim 1, wherein the redundancy cell array is distributed between at least two sectors.

8. The memory device of claim 1, wherein the redundancy cell array includes one data byte per sector and three address bytes per sector.

9. The memory device of claim 1, wherein the redundancy cell array includes a data portion in a first sector.

10. The memory device of claim 9, wherein the redundancy cell array includes an address portion in a second sector.

11. The memory device of claim 9, wherein the redundancy cell array includes a status portion in a third sector.

12. A method for automatically repairing a defective memory cell in a memory device, comprising:

writing data to a working memory cell;

reading the data written to the working memory cell;

comparing the data written to the working memory cell to the data read from the working memory cell; and if the data written to the working memory cell and the data read from the working memory cell are not equal, then:
   writing the data to a redundancy memory cell; and
   updating an address of the redundancy memory cell and an address of the working memory cell in a lookup table.

13. The method of claim 12, further comprising reading data written to the redundancy memory cell.

14. The method of claim 13, wherein the redundancy memory cell is a first redundancy memory cell, and the method further comprises the operations of:

comparing the data written to the first redundancy memory cell to the data read from the first redundancy memory cell; and if the data written to the first redundancy memory cell and the data read from the first redundancy memory cell are not equal, then:
   writing the data to a second redundancy memory cell.

15. The method of claim 12, further comprising:
detecting a power off condition in the memory device; and
storing the lookup table.

16. The method of claim 15, wherein the operation of storing the lookup table includes storing the lookup table in a redundancy cell array that includes the redundancy memory cell.

17. The method of claim 12, further comprising:
detecting a power on condition in the memory device; and
initiating the lookup table.

18. The method of claim 17, wherein the operation of initiating the lookup table includes reading the lookup table from a redundancy cell array that includes the redundancy memory cell.

19. The method of claim 12, further comprising:
receiving an access address including an address of the working memory cell; and
if the working memory cell is correlated to the redundancy memory cell in the lookup table, accessing the redundancy memory cell.

20. A method for accessing a memory device, comprising:
receiving an address for data;
determining whether the address is included in a lookup table;
if the address is not included in the lookup table, accessing the data in the working memory cell; and
if the address is included in the lookup table, accessing the data in a redundancy memory cell at an address corresponding to the address in the lookup table.

* * * * *